US007180197B2

(12) United States Patent
Nishi et al.

(10) Patent No.: US 7,180,197 B2
(45) Date of Patent: Feb. 20, 2007

(54) SEMICONDUCTOR DEVICE CONTAINING STACKED SEMICONDUCTOR CHIPS AND MANUFACTURING METHOD THEREOF

(75) Inventors: Kazuo Nishi, Kofu (JP); Hiroki Adachi, Kai (JP); Naoto Kusumoto, Isehara (JP); Yuusuke Sugawara, Minami-alps (JP); Hidekazu Takahashi, Isehara (JP); Daiki Yamada, Isehara (JP); Yoshikazu Hiura, Minami-alps (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/951,811

(22) Filed: Sep. 29, 2004

(65) Prior Publication Data

US 2005/0082655 A1 Apr. 21, 2005

(30) Foreign Application Priority Data

Oct. 6, 2003 (JP) ............................. 2003-347678

(51) Int. Cl.
*H01L 23/48* (2006.01)
*H01L 23/52* (2006.01)
*H01L 29/40* (2006.01)

(52) U.S. Cl. .................. 257/783; 257/753; 257/687; 257/688; 257/729; 257/E21.514; 257/E21.584

(58) Field of Classification Search ............... 257/687, 257/688, 729, 734, 782, 783, 753, E23.16, 257/E21.514, E21.584; 438/118, 119, 628, 438/644, 654

See application file for complete search history.

(56) References Cited

U.S. PATENT DOCUMENTS

| 4,423,435 | A | * | 12/1983 | Test, II ..................... 361/783 |
| 5,501,989 | A | | 3/1996 | Takayama et al. |
| 5,589,694 | A | | 12/1996 | Takayama et al. |
| 5,744,822 | A | | 4/1998 | Takayama et al. |
| 5,965,064 | A | * | 10/1999 | Yamada et al. ............. 252/512 |
| 6,461,890 | B1 | * | 10/2002 | Shibata ........................ 438/106 |
| 6,555,917 | B1 | * | 4/2003 | Heo ............................. 257/777 |
| 6,624,921 | B1 | * | 9/2003 | Glenn et al. ................ 359/291 |
| 6,700,133 | B1 | * | 3/2004 | Ohtani et al. ................. 257/66 |
| 7,071,488 | B2 | | 7/2006 | Kimura |

FOREIGN PATENT DOCUMENTS

| JP | 4-107955 | * | 4/1992 |
| JP | 3329512 | | 7/2002 |
| JP | 2003-060744 | | 2/2003 |

* cited by examiner

*Primary Examiner*—Jasmine Clark
(74) *Attorney, Agent, or Firm*—Eric J. Robinson; Robinson Intellectual Property Law Office, P.C.

(57) ABSTRACT

The present invention provides a semiconductor device having a structure that can be mounted on a wiring substrate, as for the semiconductor device formed over a thin film-thickness substrate, a film-shaped substrate, or a sheet-like substrate. In addition, the present invention provides a method for manufacturing a semiconductor device that is capable of raising a reliability of mounting on a wiring substrate. One feature of the present invention is to bond a semiconductor element formed on a substrate having isolation to a member that a conductive film is formed via a medium having an anisotropic conductivity.

50 Claims, 7 Drawing Sheets

SEMICONDUCTOR DEVICE CONTAINING STACKED SEMICONDUCTOR CHIPS AND MANUFACTURING METHOD THEREOF

BACKGROUND OF THE INVENTION

1. Field of the Invention

The present invention relates to a semiconductor device that is thin and lightweight, and a manufacturing method thereof. Specifically, a semiconductor device using a substrate having a thin thickness or a film-shaped substrate, and a manufacturing method thereof.

2. Description of the Related Art

In recent years, cellular phones spread with the progress of communication technology. It is expected that cellular phones transmit moving image and more communication are expected more in future. On the other hand, laptop computers for mobile have been produced due to the weight saving. A large number of personal digital assistances referred to as PDA that begin from electronic notebook have been produced, and diffused. Moreover, most of such personal digital assistances are each mounted with a flat panel display by the development of display devices.

In such a display device, the brightness around the display device is detected, and its display luminance is adjusted. Thus, by detecting the brightness around the display device to obtain moderate display luminance, useless electric power can be reduced. For example, such an optical sensor apparatus for controlling luminance is used for cellular phones and laptop computers (for example, Patent Document 1).

As a material for an optical sensor, semiconductor is mainly used. Silicon is taken as a representative example of a semiconductor material. An optical sensor using silicon is formed by single crystal silicon or polysilicon, or amorphous silicon. An optical sensor using single crystal silicon or polysilicon has the highest sensitivity in an infrared region at around 800 nm, and has sensitivity at most around 1100 nm. Therefore, in the case that the optical sensor using single crystal silicon or polysilicon senses white fluorescent light that hardly include a spectrum of an infrared region and sunlight that has a wide spectrum from an ultraviolet region to an infrared region, there is a problem that sensing result of each light is different while actual brightness is the same.

On the other hand, an optical sensor using amorphous silicon hardly has sensitivity against light in an infrared region, and has the highest sensitivity in a range of approximately 500 to 600 nm that is central of wavelength of visible light region. In addition, the optical sensor using amorphous silicon has sensing characteristics that is like human visibility. Therefore, amorphous silicon is preferably used for the optical sensor.

A plastic substrate is thin and lightweight. Therefore, a wiring substrate that is mounted with an optical sensor formed over the plastic substrate and electronic devices using the wiring substrate can be manufactured to be thin and downsized.

Moreover, in the case of manufacturing an optical sensor using film-shaped substrate, a Roll-To-Roll method can be used. Therefore, the productivity of such optical sensor is improved.

[Patent Document 1] Japanese Patent Laid-Open No. 2003-60744 bulletin

However, a connection terminal of a wiring substrate cannot be formed on a side face of a plastic substrate because of its thin thickness. Therefore, the connection terminal is formed on one face, that the face that faces the wiring substrate. The wiring substrate and an optical sensor are fixed by only one face via a conductive material. The area of the face is small, thus, there is a problem that the mounting intensity is weaker than that of a side electrode structure.

In addition, it is difficult to see a junction between an electrode terminal of the optical sensor and an electrode pat to judge whether they connect to each other surely, because a region where the wiring substrate is connected to the optical sensor is the lower part of a substrate of the optical sensor.

Moreover, a film-shaped optical sensor is hard to mount over the wiring substrate because of its flexibility.

SUMMARY OF THE INVENTION

In view of the foregoing, it is an object of the present invention to provide a semiconductor device having the structure that can be mounted on a wiring substrate and is formed over a thin substrate, a film-shaped substrate, or a sheet-like substrate. It is another object of the present invention to provide a manufacturing method of a semiconductor device that can enhance the reliability of mounting the semiconductor device over a wiring substrate.

According to one aspect of the present invention, a manufacturing method of a semiconductor device is provided that comprises bonding a semiconductor element formed over a substrate having insulation to a member that a conductive film is formed via a medium having anisotropic conductivity. Note that it is preferable that the member provided with a conductive film is a member in which a conductive film is formed at edge portions, that is, the conductive films each of which is formed over at least one face of the member.

As the medium having anisotropic conductivity, a medium dispersed with conductive particles in a paste form or a film-shaped can be nominated.

As the substrate having insulation, a thin substrate that has a film thickness from 0.1 to 1 mm, a film-shaped substrate, and a sheet-like substrate can be nominated. As a representative example, a glass substrate, a plastic substrate, and a substrate formed by organic resin, and the like, can be nominated.

As the method for bonding the substrate having insulation and the member that the conductive film is formed via a medium having anisotropic conductivity, a pressure bonding method that adds load partially is given. In this case, it is preferably to apply load to the substrate and the member, and the while adding heat or ultrasonic wave thereto. When pressure bonding is carried out while applying ultrasonic wave, vibrational energy is transmitted to a conductive particle from each of the terminal, that is, an electrode terminal and a connection terminal. As a result, friction is generated between each of the terminal and the conductive particle, and joining of each of the terminal and the conductive particle is promoted by means of energy due to the frictional heat. Therefore, joining at low temperature is possible.

According to one aspect of the present invention, a semiconductor device is provided that has a substrate formed over a semiconductor element and a substrate provided with a conductive film at the edge portions (an interposer), and either surface of the substrate provided with the semiconductor element and the substrate provided with the conductive film are fixed to each other via an anisotropic conductive member.

The substrate having insulation and the interposer are fixed to each other via the semiconductor element and the anisotropic conductive member.

It is preferable that an area of the substrate provided with the semiconductor element and an area of the interposer is approximately the same. Moreover, the area of the substrate provided with the semiconductor element may be larger than the area of the interposer. In this case, a region provided with the semiconductor element is increased. Therefore, a further integrated semiconductor device can be manufactured. In addition, the area of the interposer may be larger than the area of the substrate provided with the semiconductor element. In this case, an area to be bonded to a wiring substrate is increased, and so the stability is increased in the mounting portion.

As a result, a semiconductor device can be mounted over the wiring substrate with high reliability.

The conductive film formed on an interposer is a connection terminal, and serves as a side electrode. The conductive film is formed to electrically connected to an electrode pat formed on a substrate for mounting a semiconductor device, for example, a wiring substrate. The conductive film is electrically connected to the electrode pat on a wiring substrate via a conductive paste to be fixed. Note that, an anisotropic conductive adhesive agent or an anisotropic conductive film can be used instead of the conductive paste.

The semiconductor element has a semiconductor film, and the semiconductor film is formed from an inorganic material or an organic material.

As a representative example of the semiconductor film formed from the inorganic material, a silicon film, a gallium film, a silicon film added with gallium, and a silicon carbide film, and the like can be given. In addition, as a representative example of the semiconductor film formed from the organic material, polymer or oligomer as typified by conjugated polymer, for example, polyphenylene vinylene derivatives, polyfluorene derivatives, polythiophene derivatives, polyphenylene derivatives, and these copolymer, oligo phenylenes, oligothiophenes can be given. Moreover, as a low molecular weight compound material, pentacenes, tetracenes, copper phthalocyanines, perfluorinated phthalocyanines (F16 H2PC), perylene derivatives are given.

In the present invention, in case that the semiconductor device is an optical sensor, a photoelectric conversion device, or a solar battery, the semiconductor film is formed from a film having silicon. As a representative example of the semiconductor film having silicon, a silicon film, silicon germanium film, a silicon carbide film, or these PN junction film, PIN junction film can be nominated. Note that, it is desirable that an I layer of the PN junction film and the PIN junction film is formed with an amorphous silicon layer.

Moreover, in a light receiving portion of the optical sensor, the photoelectric conversion device, or the solar battery, an amplifier circuit to amplify the quantity of detected light received in the light receiving portion, or an amplification element may be provided. As a representative example of the amplifier circuit, a current mirror circuit formed from a TFT can be nominated. As a representative example of the amplification element, an operational amplifier can be nominated.

Moreover, as the semiconductor device of the present invention, an integrated circuit that is formed from a TFT can be nominated, in addition to the optical sensor, the photoelectric conversion device, and the solar battery.

As a representative example of the integrated circuit formed by using TFT, memory, CPU, and the like can be nominated.

In the semiconductor device according to the present invention, the semiconductor element can be electrically connected to a connection terminal (side electrode) of the interposer, therefore, an area to be joined to the wiring substrate is increased. That is, a joining mode can be checked with eyes, in addition that mounting intensity can be raised.

Moreover, the connection of the semiconductor element and the interposer is strong because these two members are bonded in an aspect of entire surface facing each other. Moreover, the cost can be reduced because these two members are connected by means of resin. In addition, resin has high fixing strength, so the semiconductor device having high breaking strength can be manufactured.

Furthermore, even if the substrate provided with the semiconductor element having flexibility like a sheet-like substrate or a film-shaped substrate, the semiconductor device according to the present invention can be mounted on a wiring substrate. In addition, in case that the heat resistance of the substrate provided with the semiconductor element is low, especially in case that the substrate having the heat resistance that is hard to withstand treatment for mounting the semiconductor device on the wiring substrate, the semiconductor device can be mounted over the wiring substrate by forming the interposer by a member having heat resistance. Therefore, the semiconductor element that is formed over a substrate having flexibility can be mounted over the wiring substrate by Roll-To-Roll method.

Hereinafter, embodiment mode of the present invention is described with reference to the drawings. However, the present invention can be carried out in many different modes, and it is easily understood by those who are in the art that embodiments and details herein disclosed can be modified in various ways without departing from the scope and spirit of the present invention. Therefore, it should be noted that the description of this embodiment mode should not be interpreted as limiting the present invention. Hereinafter, this embodiment mode is described using an optical sensor as a representative example of a semiconductor device, but is not limited to this, and may be applied to the integrated circuit or the like that is formed by using a photoelectric conversion element, the solar battery, and TFT.

These and other objects, features and advantages of the present invention will become more apparent upon reading of the following detailed description along with the accompanied drawings.

DETAILED DESCRIPTION OF THE INVENTION

EMBODIMENT MODE 1

An optical sensor of the present invention is described with reference to FIGS. 1A and 1B.

Figure 1A:
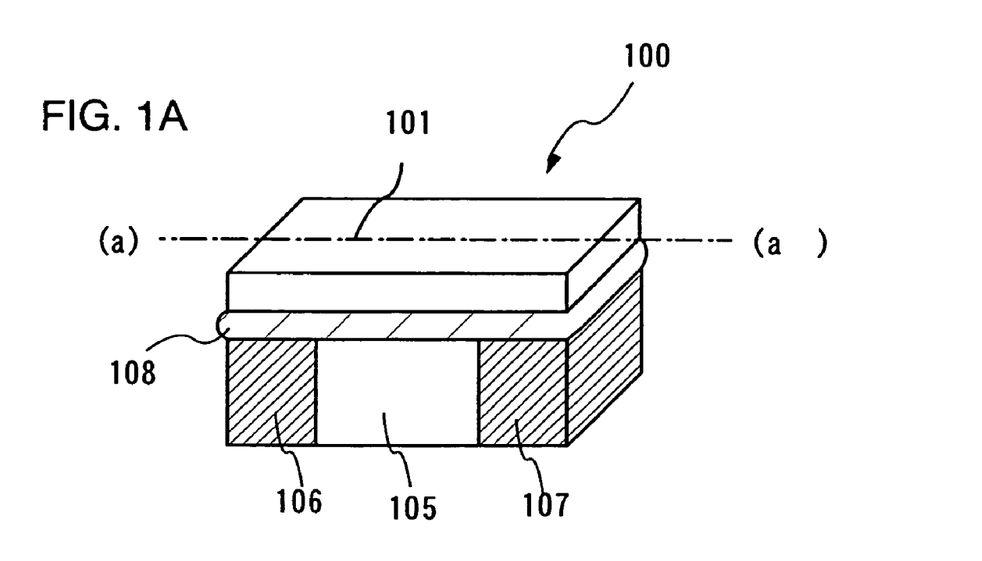
FIGS. 1A and 1B are explanatory perspective and cross-section views for a semiconductor device according to the present invention.

FIG. 1A is a perspective view for showing an optical sensor 100. The optical sensor 100 is composed of a plastic substrate 101 provided with a semiconductor element (not shown in the figure), a heat-resistant substrate 105 (hereinafter, an interposer) provided with conductive films 106 and 107 at both ends portions of the heat-resistant substrate, and an adhesive agent 108 for bonding the plastic substrate 101 to the heat-resistant substrate 105 together.

Figure 1B:
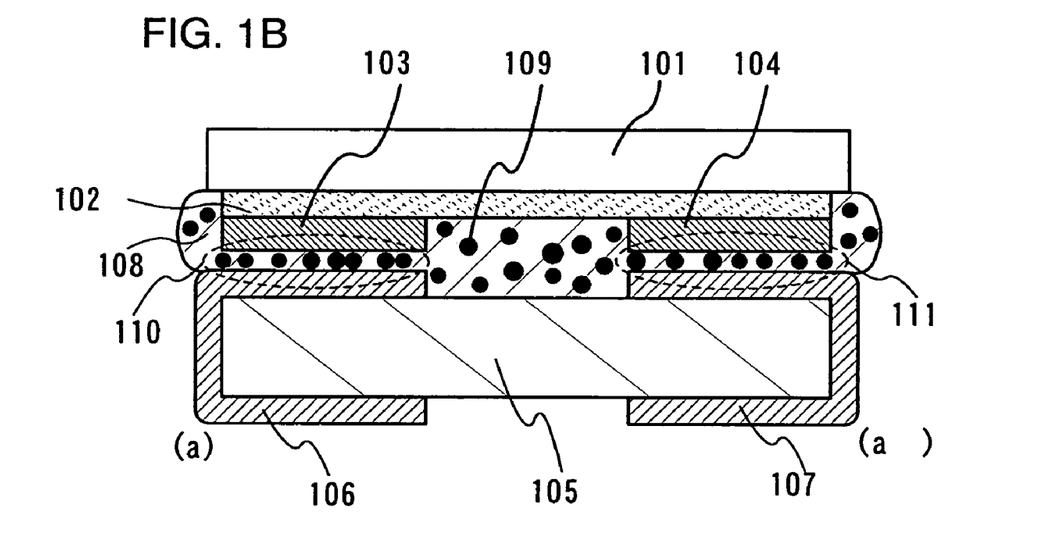

FIG. 1B is a cross-sectional view taken along line (a)–(a') of FIG. 1A. A semiconductor element 102 is formed over a plastic substrate 101, and electrode terminals 103 and 104 that are leading out electrodes of the semiconductor element are formed. In this embodiment mode, the semiconductor element serves as a light receiving portion. Moreover, connection terminals (side electrodes) 106 and 107 are formed at both ends of the interposer 105. The light receiving portion over the plastic substrate and the interposer are bonded to each other via an anisotropic conductive adhesive agent 108. In addition, the electrode terminals 103 and 104 and the connection terminals (side electrodes) 106 and 107 are electrically connected to each other via conductive particles 110 and 111 of an anisotropic conductive film.

As the plastic substrate, a plastic having a thickness of from 0.1 to 1 mm, a film-shaped plastic, and a sheet-like plastic can be nominated.

As representative examples of the plastic substrate, a plastic substrate formed from PET (polyethylene terephthalate), PEN (polyethylene naphthalate), PES (polyether sulfide), polypropylene, polypropylene sulfide, polycarbonate, polyetherimide, polyphenylene sulfide, polyphenylene oxide, polysulfone, or polyphthalamide, or a substrate including an organic material dispersed with inorganic particles of several nanometers in diameter, or the like can be nominated. In addition, a surface of the plastic substrate is not required to be flat, and may be uneven or have a curved surface.

Moreover, instead of the plastic substrate, a glass substrate having a thickness of from 0.1 to 1 mm, more preferably, 0.2 to 0.5 mm, or a film-shaped glass or sheet-like glass can be used.

As examples of the interposer, a glass epoxy resin substrate, a polyimide substrate, a ceramic substrate, a glass substrate, an alumina substrate, an aluminum nitride substrate, and a metal substrate, or the like is representatively given.

As a representative example of the anisotropic conductive adhesive agent, adherent resin containing dispersed conductive particles (grain diameter: approximately of from 3 to 7 μm) such as epoxy resin and phenol resin is given. Moreover, the conductive particles (grain diameter: approximately of from 3 to 7 μm) are formed from one element or a plurality of elements selected from the group consisting of gold, silver, copper, palladium, and platinum. In addition, particles in which the elements coat in a multilayer structure may be used.

Furthermore, conductive particles formed by resin coated with thin film formed by one element or a plurality of elements selected from the group consisting of gold, silver, copper, palladium, and platinum may be used.

Moreover, instead of the anisotropic conductive adhesive agent, an anisotropic conductive film that is formed in film-shaped over a base film may be used by being pasted to the interposer, and then, the base film is taken off. The anisotropic conductive film is dispersed with the conductive particles that are similar to those dispersed to the anisotropic conductive adhesive agent.

As a material for the electrode terminals 103 and 104 that is electrically connected to the light receiving portion, one element selected from the group consisting of nickel (Ni), copper (Cu), zinc (Zn), palladium (Pd), silver (Ag), tin (Sn), platinum (Pt), and gold (Au), and more preferably, nickel (Ni), copper (Cu), silver (Ag), platinum (Pt), and gold (Au); or an alloy material including at least 50% of the element may be nominated. Nickel (Ni), silver (Ag), palladium (Pd), platinum (Pt), or gold (Au) can be ohmic contact to a silicon semiconductor layer and alloyed with solder, and can be used in a single layer. These metal are not always necessarily a single composition, and may be an alloy composition including the metal as the main component. However, as used herein, the term "alloy" refers to an alloy including at least 50% of base metal component.

As a material for the connection terminals (side electrodes) 106 and 107 that are formed at the edge portions of the interposer, one element selected from the group consisting of nickel (Ni), copper (Cu), zinc (Zn), palladium (Pd), silver (Ag), tin (Sn), platinum (Pt), and gold (Au), and more preferably, nickel (Ni), copper (Cu), silver (Ag), platinum (Pt), and gold (Au); or an alloy material including at least 50% of the element may be nominated.

The semiconductor element includes a semiconductor film, and the semiconductor film is formed from an inorganic material or an organic material.

As a representative example of the semiconductor film formed from the inorganic material, a silicon film, a gallium film, a silicon film added with gallium, a silicon carbide film, and the like can be given. In addition, as a representative example of the semiconductor film formed from the organic material, polymer or oligomer as typified by conjugated polymer, for example, polyphenylene vinylene derivatives, poly fluorenes derivatives, poly thiophenes derivatives, polyphenylene derivatives, and these copolymer, oligo phenylenes, oligothiophenes can be given. Moreover, as a low molecular weight compound material, pentacenes, tetracenes, copper phthalocyanines, perfluorinated phthalocyanines (F16 H2PC), phthalocyanines, perylenes, and the like are given.

As a semiconductor device of this embodiment mode is the optical sensor, the semiconductor film is formed from a film having silicon. As a representative example of the semiconductor film having silicon, a silicon film, silicon germanium film, a silicon carbide film, or these PN junction film, PIN junction film can be nominated. Note that, it is desirable that an I layer of the PN junction film and the PIN junction film is formed with an amorphous silicon layer.

In the semiconductor device according to the present invention, the semiconductor element can be electrically connected to a connection terminal (side electrode) of the interposer, therefore, an area to be joined to the wiring substrate is increased. That is, a joining mode can be checked with eyes, in addition that mounting intensity can be raised. Therefore, reliability in process can be raised. Moreover, the semiconductor element is formed over the substrate, and a substrate area and the region that serves as the semiconductor element is approximately equal. Therefore, the semiconductor element can be highly integrated over the wiring substrate or the like.

Moreover, connection of the semiconductor element and the interposer is strong since these two members are bonded in an aspect of entire surface facing each other.

In addition, the semiconductor element is connected to the interposer via resin. Therefore, the cost can be reduced in case of using resin in comparison with using metallic paste such as solder. Moreover, resin has high fixing strength, so the semiconductor device having high breaking strength can be manufactured.

EMBODIMENT MODE 2

In this embodiment mode, a method for mounting of an optical sensor shown in Embodiment Mode 1 over a wiring substrate is described with reference to FIG. 2.

Figure 2:
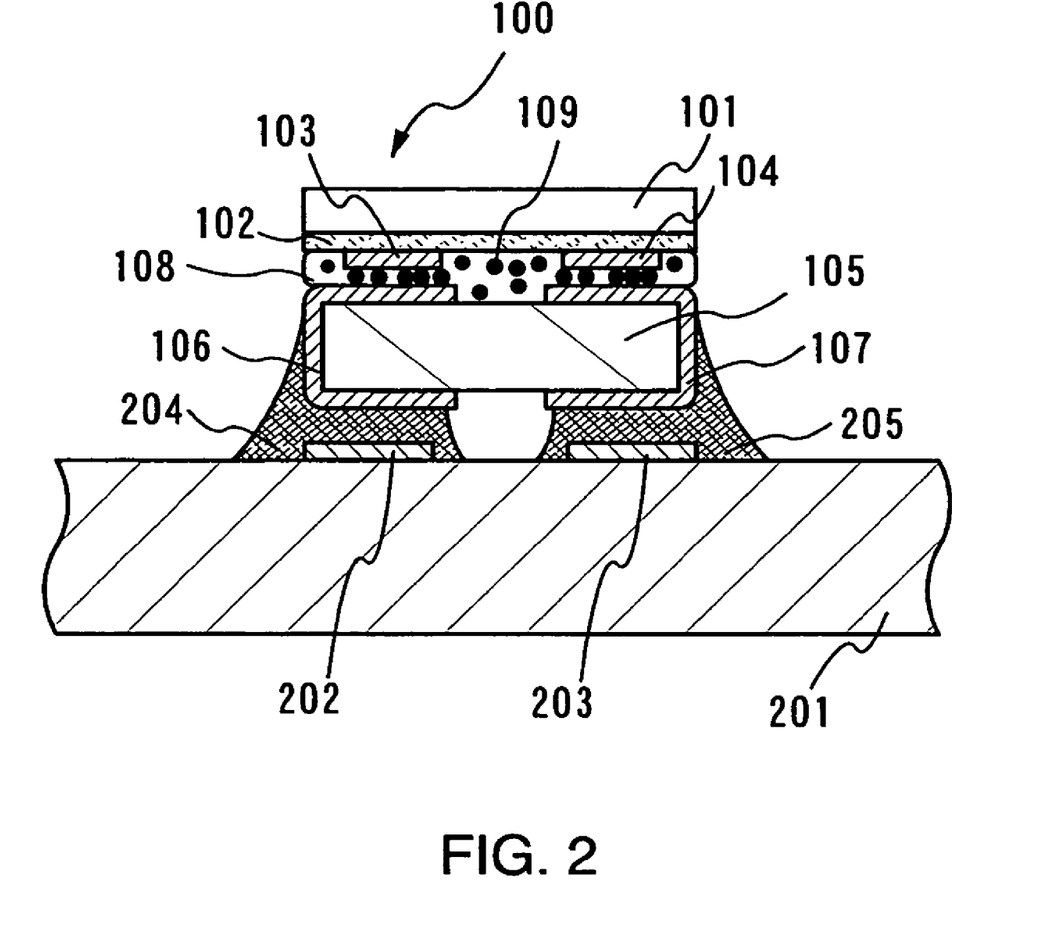
FIG. 2 is an explanatory cross-sectional view for a semiconductor device according to the present invention that is mounted on a wiring substrate.

FIG. 2 is a cross-sectional view for showing that an optical sensor 100 is mounted over a wiring substrate 201. An interposer 105 in which connection terminals (side electrodes) 106 and 107 are formed and a semiconductor element 102 (in this embodiment mode, a light receiving portion) that is formed on a plastic substrate 101 are bonded to each other via an anisotropic conductive adhesive agent 108. Moreover, electrode terminals 103 and 104 of the light receiving portion and the connection terminals (side electrodes) 106 and 107 that is formed at edge portions of the interposer is electrically connected to each other via a conductive particle 109 that is included in the anisotropic conductive adhesive agent 108.

In addition, connection terminals (side electrodes) 106 and 107 that are formed on the interposer and electrode pats 202 and 203 on the wiring substrate are respectively connected to each other via soldering paste 204 and 205.

In this embodiment mode, an optical sensor is mounted over a wiring substrate by reflow step. Specifically, a conductive paste is applied to predetermined area of electrode pat by screen printing or dispense, and the optical sensor is attached thereon with mounter. Thereafter, the conductive paste is heated and melted at temperatures ranging of from 250 to 350° C. Then, both of the electrode terminals of the optical sensor and the connection terminals, and the electrode pats over the wiring substrate are connected electrically and mechanically to each other.

As examples of heating method, infrared heating, vapor phase soldering, hot blast heating, heating on hot plate, and heating by laser irradiation, and the like are given.

Moreover, instead of mounting method by reflow step using conductive paste, an optical sensor may be mounted over the wiring substrate by partial pressure bonding using an anisotropic conductive adhesive agent or an anisotropic conductive film.

In the semiconductor device according to the present invention, the semiconductor element can be electrically connected to a connection terminal (side electrode) of the interposer, therefore, an area to be joined to the wiring substrate is increased. That is, a joining mode can be checked with eyes, in addition that mounting intensity can be raised. Therefore, reliability in process can be raised. Moreover, the semiconductor element is formed over the substrate, and a substrate area and the region that serves as the semiconductor element is approximately equal. Therefore, the semiconductor device can be highly integrated over the wiring substrate or the like.

Moreover, the connection of the semiconductor element and the interposer is strong since these two members are bonded in an aspect of an entire surface facing each other via resin.

In addition, since the semiconductor element and the interposer are connected to each other by using resin, the cost can be reduced than that when metal paste is used. Moreover, resin has high fixing strength, and so the semiconductor device having high breaking strength can be manufactured.

EMBODIMENT MODE 3

In this embodiment mode, a light receiving portion of an optical sensor that is a semiconductor element shown in embodiment mode 1 and 2 is described with reference to FIG. 3 to FIG. 4B.

Figure 3:
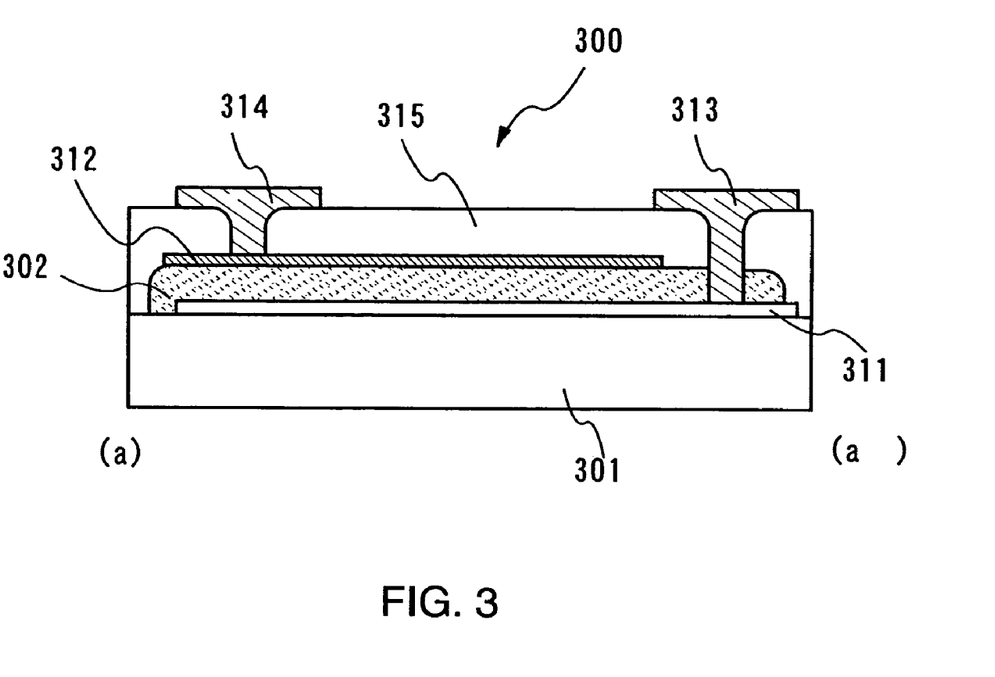
FIG. 3 is an explanatory cross-sectional view for a semiconductor device according to the present invention.

FIG. 3 is a cross-sectional view for showing an optical sensor 300 of the present invention. A first electrode 311, a light receiving portion 302, and a second electrode 312 are formed over a plastic substrate 301. The first electrode is connected to a first electrode terminal 313, and the second electrode is connected to a second electrode terminal 314. The first electrode terminal 313 and the second electrode terminal 314 are electrically insulated with an interlayer insulating film 315 therebetween. The first electrode terminal and the second electrode terminal are terminals for connecting to a wiring on a wiring substrate.

In the case that light is incident from the plastic substrate 301 side, the first electrode is formed from a conductive film that ohmic contact with a semiconductor layer formed from silicon is possible and that is light transmitting. Representatively, ITO (indium tin oxide alloy), indium oxide zinc oxide alloy ($In_2O_3$—ZnO), zinc oxide (ZnO), and indium tin oxide alloy including silicon oxide, or the like can be used. Moreover, the second electrode is formed from a metal film that ohmic contact with the semiconductor layer formed from silicon is possible. As a representative example of this, one element selected from the group consisting of aluminum (Al), titanium (Ti), chrome (Cr), nickel (Ni), molybdenum (Mo), palladium (Pd), tantalum (Ta), tungsten (W), platinum (Pt), and gold (Au); or an alloy material including at least 50% of the element are given. On the other hand, in case that light is incident from the interlayer insulating film side, the first electrode is formed from a metal film that ohmic contact with the semiconductor layer formed from silicon is possible. A conductive film that ohmic contact with a semiconductor layer formed from silicon is possible and that is light transmitting is used for the second electrode.

The first electrode terminal 313 and the second electrode terminal 314 are leading out electrodes, and are each a terminal to electrically connect the first electrode and the second electrode to an external wiring. Therefore, the first electrode terminal and the second electrode terminal are each formed from a material that is possible to be connected to the first electrode, the second electrode, and a connection terminal. Representatively, one element selected from the group consisting of nickel (Ni), copper (Cu), zinc (Zn), palladium (Pd), silver (Ag), tin (Sn), platinum (Pt), and gold (Au), and more preferably, nickel (Ni), copper (Cu), silver (Ag), platinum (Pt), and gold (Au); or an alloy material including at least 50% of the element are given.

The interlayer insulating film 315 is formed to electrically insulate the electrode terminal that is the leading out electrode, in addition to suppress deterioration by sealing the first electrode 311 and the second electrode 312, and the light receiving portion 302. The interlayer insulating film can be formed from organic resin such as acryl, polyimide, polyamide, polyimidamide, and benzocyclobutene, or an inorganic material such as silicon oxide film, silicon nitride oxide film, and a silicon oxynitride film.

In addition, the structure of the optical sensor can be not only the cross-sectional view shown in FIG. 3 but also other structures. FIGS. 4A and 4B each show cross-sectional views for showing the structure of an optical sensor different from that illustrated in FIG. 3.

Figure 4A:
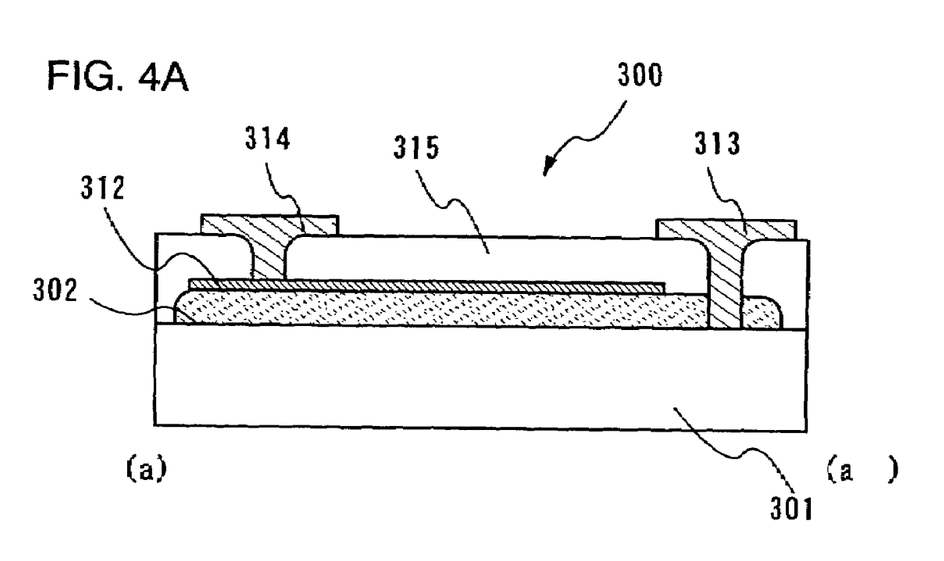
FIGS. 4A and 4B are explanatory cross-sectional views for a semiconductor device according to the present invention.

FIG. 4A is one example of a cross-sectional view for showing a light receiving portion of an optical sensor 300. The sensor is formed from a light receiving portion 302, a first electrode terminal 313 and a second electrode 312 each of which is in contact with the light receiving portion, an electrode terminal 314 that is connected to the second electrode. The sensor does not have a first electrode, which is different from the light receiving portion of the optical sensor of FIG. 3. Therefore, an area that the first electrode terminal 313 contacts with the light receiving portion 302 is increased, thus the number of connection sections (contact sections) is preferable to be large. In this structure, there is not a first electrode, thus there is an effect that a transmittance of light that transmits from a substrate 301 can be enhanced, in addition that the number of steps can be reduced.

Figure 4B:
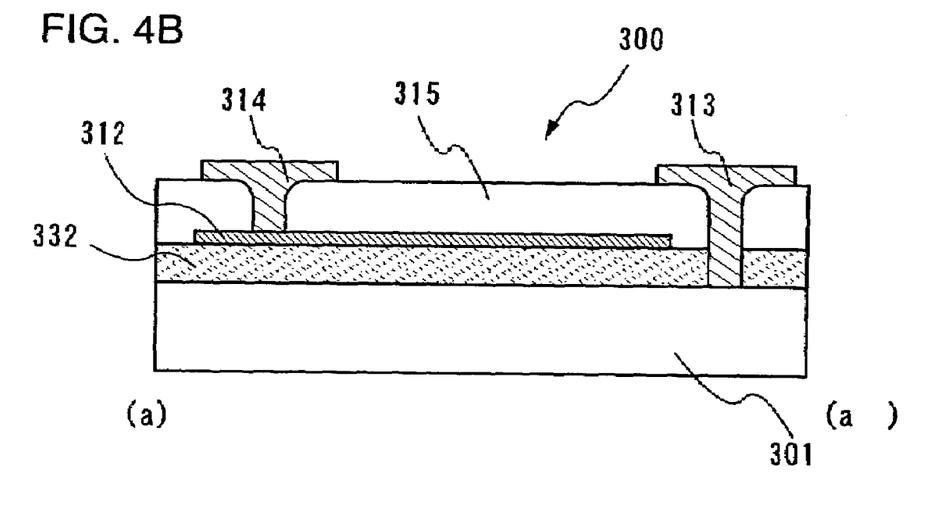

FIG. 4B is one example of a cross-sectional view for showing a light receiving portion of an optical sensor. The sensor is formed from a light receiving portion 332, a first electrode terminal 313 and a second electrode 312 each of which is in contact with the light receiving portion, an electrode terminal 314 that is connected to the second electrode. A light receiving layer is formed on entire surface of the substrate 301 without being patterned the light receiving layer, which is different from the light receiving portion of the optical sensor of FIG. 4A. Therefore, the light receiving layer can be formed without using a mask, and it is not necessary to control position of the mask. Thus, yield can be improved.

In the semiconductor device according to the present invention, the semiconductor element can be electrically connected to a connection terminal (side electrode) of the interposer, therefore, an area to be joined to the wiring substrate is increased. That is, a joining mode can be checked with eyes, in addition that mounting intensity can be raised. Therefore, reliability in process can be raised.

Moreover, connection of the semiconductor element and the interposer is strong because these two members are bonded in an aspect of entire surface facing each other by resin. In addition, because the semiconductor element and the interposer are connected to each other by using resin, the cost can be reduced. Moreover, resin has high fixing strength, thus the semiconductor device having high breaking strength can be manufactured. Furthermore, by forming the light receiving layer using amorphous silicon, an optical sensor having sensing characteristics like human visibility can be formed.

EMBODIMENT 1

Embodiment of the present invention is described by using FIG. 5A to FIG. 7D. FIG. 5A, FIG. 5C, FIG. 6A, FIG. 6C, FIG. 7A, and FIG. 7C are top views for showing a substrate, and FIG. 5B, FIG. 5D, FIG. 6B, FIG. 6D, FIG. 7B, and FIG. 7D are cross-sectional views for showing (b)–(b') region in them.

Figure 5A:
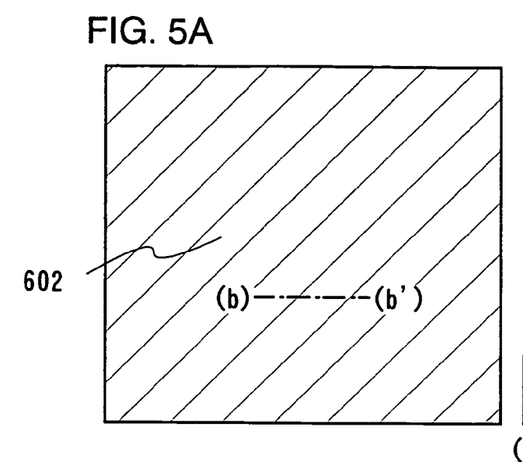
FIGS. 5A to 5D are explanatory views for a manufacturing step of a semiconductor device according to the present invention.
Figure 5B:
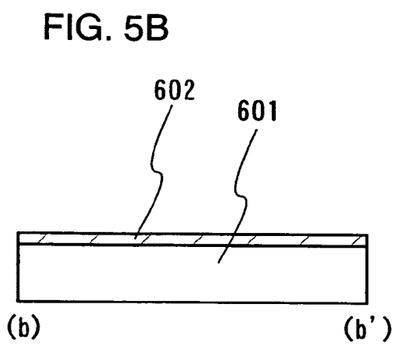

As shown in FIGS. 5A and 5B, a semiconductor film is formed on a plastic substrate 601 with a plasma CVD apparatus. Here, a silicon semiconductor film 602 having respective conductive type p, i, and n is formed as the semiconductor film. Herein, the I layer which is a light receiving portion has amorphous phase, and phase states of p and n are not considered. The film thickness of the I layer is fit in an illuminance range of an intended element to be set in a range of 100 to 1000 nm. In this embodiment, a PEN film is used as the plastic substrate, and the silicon semiconductor film is formed to have a thickness of 800 nm thereon.

Figure 5C:
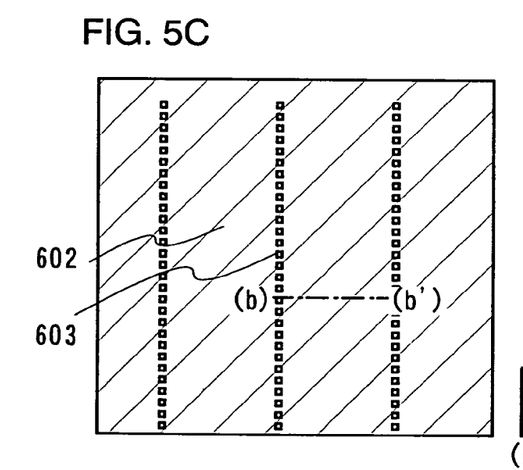
Figure 5D:
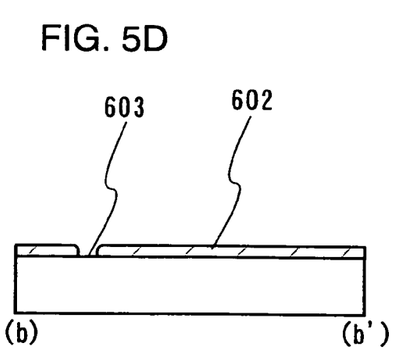

Then, a contact hole 603 is formed like a point at a predetermined portion in a laser scribe step in order that a p-type silicon film that is in a lower portion of the formed semiconductor film is to be joined with a metal electrode formed in the next step as shown in FIGS. 5C and 5D. In this step, it is preferably scribed to leave a p layer at the bottom of the contact hole, but it is difficult to control in the depth direction by a laser, and thus, the contact hole may penetrate to the surface of the plastic substrate to ensure a process margin. Accordingly, the actual contact portion is a small region in which the thickness of the p layer is exposed to a wall face of the contact hole, and thus, a large number of independent holes are formed to increase the contacting area. Further, energy density of an edge and a center of a laser beam can be sequentially changed with a gentle slope by controlling the focus of a laser beam to defocus intentionally by using a condensing optical system. Laser scribing is performed in this state to generate a taper in a wall face of a scribed portion, thereby enlarging more contact areas. In this embodiment, a YAG laser having a wavelength of 1.06 μm and a beam diameter (φ) of 60 μm is used to scan the laser beam with an oscillating frequency of 1 kHz not to be overlapped.

Figure 6A:
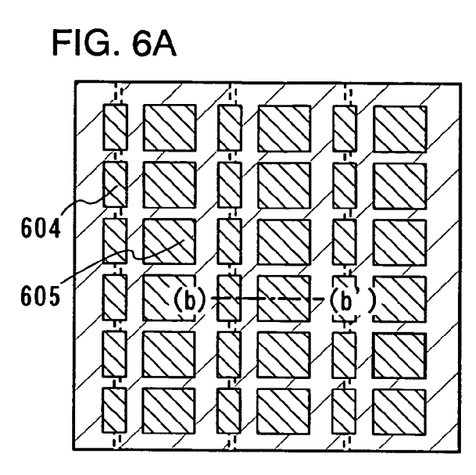
FIGS. 6A to 6D are explanatory views for a manufacturing step of a semiconductor device according to the present invention.
Figure 6B:
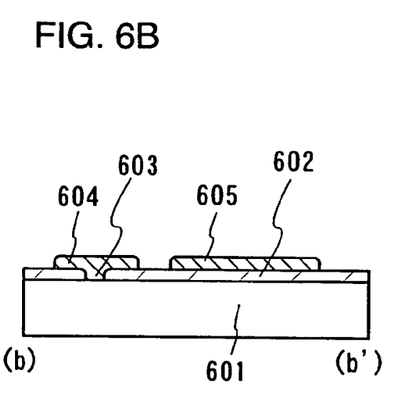

Then, as shown in FIGS. 6A and 6B, a first electrode 604 and a second electrode 605 are formed. A metal conductive film is formed to have a single layer structure or a laminated structure as the first electrode and the second electrode. As the film formation method, a sputtering method, a vapor deposition method or a plating method may be employed, or the methods are employed together. In the case of using a vapor phase method such as sputtering or vapor deposition, a desired electrode shape can be obtained easily by using a metal mask. Two opening portions for one element are formed in the metal mask, and electrodes of the both poles are formed simultaneously. The metal mask, the plastic substrate and a plate-like magnet are set in this order to be overlapped with one another in a sputtering apparatus, and inhomogeneous of the electrode area due to wrap-around deposited film is prevented by bonding the metal mask to the plastic substrate tightly. In the case of using a plating method, by conducting masking on resin in advance by screen printing in the region where a metal electrode is not required, a desired electrode shape can be obtained by a lift-off method after forming a metal electrode. The first electrode and the second electrode 604 and 605 ranging of 0.5 to 100 μm in thickness are formed under the above-described conditions.

In this embodiment, an Ni metal is deposited by using a metal mask with a sputtering method. The metal mask is 0.1 mm in thickness and is formed from nickel. The metal mask and the plastic substrate are set in the sputtering apparatus in the state that the metal mask and the plastic substrate are tightly bonded to each other via a plat-like magnet. A film that is 1.5 μm and is formed from nickel is formed by using a Ni target of six inches in diameter and of purity 99.99% and by discharging in an argon atmosphere of 1.0 Pa, with an RF output of 1.0 kW by sputtering.

Figure 6C:
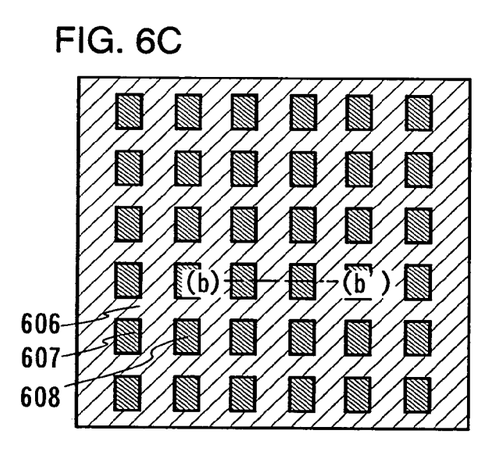
Figure 6D:
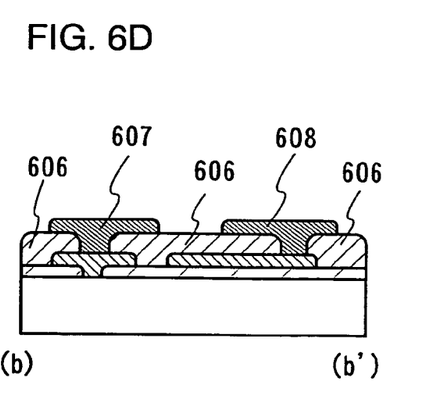

Then, as shown in FIGS. 6C and 6D, an insulating film 606 is formed, in which portions of the first electrode 604 and the second electrode 605 are each exposed and opened. Screen printing is employed for forming the insulating film. Alternatively, the insulating film may be formed over the entire face of the substrate by a CVD method or an application method, and then, a portion thereof may be etched to form contact holes so that each electrode, that is, the electrodes 604 and 605, is exposed. By opening the contact holes symmetrically, it is possible that an optical sensor can be prevented from tilting when it is mounted on a wiring substrate.

Electrode terminals 607 and 608 that are leading out electrodes are formed in contact holes where portions of the electrodes 604 and 605 are exposing respectively. The electrode terminals can be formed from a conductive film having a metal element such as silver, gold, copper, platinum, or nickel. In this embodiment, a leading out electrode of 1.35×1.8 mm$^2$ is formed. In this embodiment, the electrode terminal is formed by using resin paste including copper with screen printing.

Figure 7A:
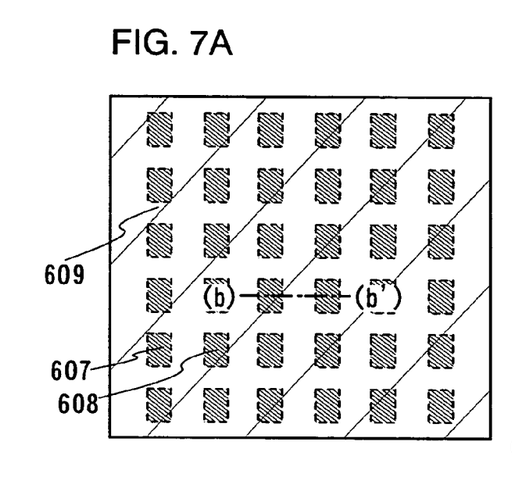
FIGS. 7A to 7D are explanatory views for a manufacturing step of a semiconductor device according to the present invention.
Figure 7B:
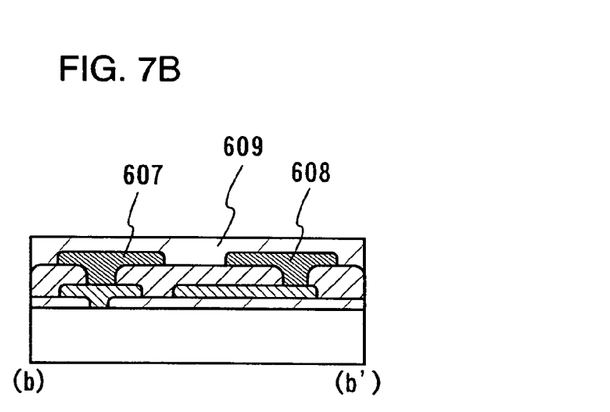

Next, an anisotropic conductive adhesive agent 609 is applied to entire surface of a substrate, as shown in FIGS. 7A and 7B. In this embodiment, epoxy resin that silver particle is dispersed is applied. Note that, the anisotropic conductive adhesive agent is applied to the substrate by application method in this embodiment, but printing method, specifically screen printing method, may be used instead of this step. In case of using the screen printing method, an adhesive agent does not hinder when the substrate is diced, because the anisotropic conductive adhesive agent is placed by taking off a dicing line to cut out an optical sensor later.

Figure 7C:
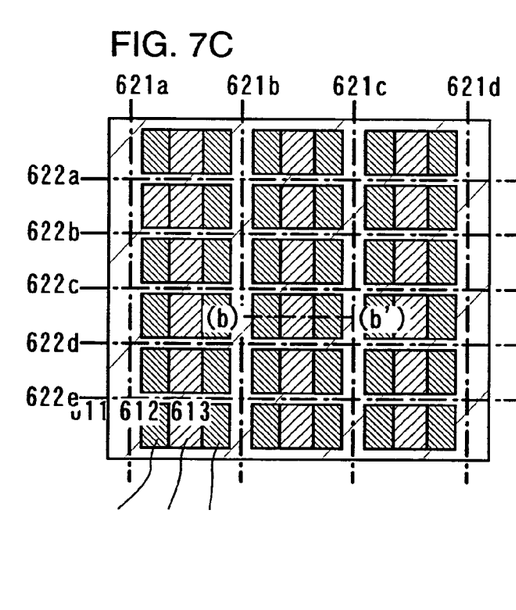
Figure 7D:
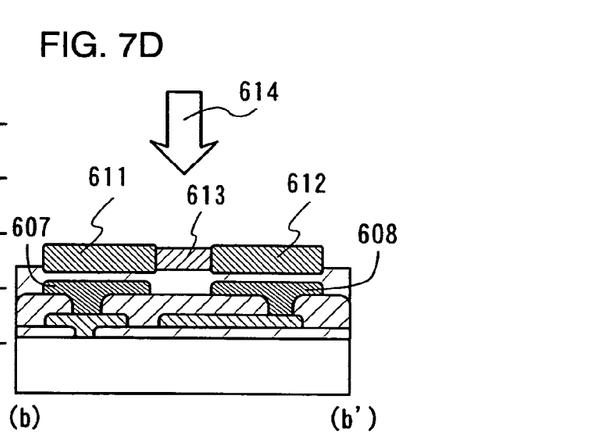

Next, as shown in FIGS. 7C and 7D, an interposer 613 that connection terminals (side electrodes) 611 and 612 are formed is placed on an anisotropic conductive adhesive agent. At this time, alignment is carried out and the interposer 613 is set so as electrode terminals 607 and 608 of an optical sensor to face the connection terminals (side electrodes) 611 and 612 that are formed in the interposer. The interposer is bonded to the substrate by thermo pressure bonding in the direction of an arrow 614.

Next, the optical sensor is cut out by a laser scribe step. In this embodiment, laser light is irradiated on a region that is parallel to a minor axis of the optical sensor and an optical sensor element is not formed (A-axis: 621$a$ to 621$d$), and in a region that is perpendicular to the minor axis of the optical sensor (that is, parallel to a major axis of the optical sensor) and the optical sensor element is not formed (B-axis: 622$a$ to 622$e$) in order to cut out the optical sensor. In this embodiment, a YAG laser having an oscillation frequency of 1 kHz, a wavelength of 1.06 μm, and a beam diameter (φ) of 60 μm is used to irradiate.

The optical sensor can be formed through the above-described steps.

In the semiconductor device according to the present invention, the semiconductor element can be electrically connected to a connection terminal (side electrode) of the interposer, therefore, an area to be joined to the wiring substrate is increased. That is, a joining mode can be checked with eyes, in addition that mounting intensity can be raised. Therefore, reliability in process can be raised. Moreover, the semiconductor element is formed over the substrate, and a substrate area and the region that serves as the semiconductor element is approximately equal. Therefore, the semiconductor device can be highly integrated over the wiring substrate or the like.

Moreover, the connection of the semiconductor element and the interposer is strong since these two members are bonded in an aspect of an entire surface facing each other. In addition, since the semiconductor element and the interposer are connected to each other via resin, the cost can be reduced. Moreover, resin has high fixing strength, and so the semiconductor device having high breaking strength can be manufactured.

EMBODIMENT 2

Various electronic devices can be manufactured by incorporating a semiconductor device obtained according to the present invention. Such electronic devices, a cellular phone, a laptop personal computer, a gaming machine, a car navigation, a portable audio equipment, a handy AV equipment, a digital camera, a film camera, an instant camera, a room air-conditioner, a car air-conditioner, a ventilation and air conditioning equipment, an electric pot, a CRT type projection TV, a lighting equipment, lighting facilities, and the like. Specific examples of the electronic devices are shown hereinafter.

An optical sensor of the present invention can be used in a cellular phone, a laptop personal computer, a digital camera, a gaming machine, a car navigation, a portable audio equipment, and the like, as a sensor for optimally adjusting brightness of a display and a backlight illuminance, and saving a battery. A solar battery can be provided for these devices equipment as a battery. The semiconductor devices can be downsized and highly integrated, and thus, electronic devices can be more downsized by using them.

The optical sensor of the present invention can be provided in a key switch of a cellular phone, and handy AV equipment as a sensor for controlling ON and OFF of a backlight LED and a cold cathode tube or a sensor for saving a battery. By being provided with a sensor, a switch is turned OFF in a bright environment, and battery consumption by a long period of button operation can be reduced. Because a semiconductor device of the present invention can be downsized and highly integrated, a more downsized electronic device and saving power consumption can be achieved.

Further, the optical sensor of the present invention can be provided in a digital camera, a film camera, and an instant camera as a sensor of a flash dimmer control or a sensor for an aperture control. In addition, a solar battery can be provided for these electronic devices as a battery. The semiconductor devices can be downsized and highly integrated, and thus, electronic devices can be more downsized by using them.

Moreover, the optical sensor of the present invention can be provided in a room air-conditioner, a car air-conditioner, and a ventilation and air conditioning equipment as a sensor for controlling airflow or temperature. Because a semiconductor device of the present invention can be downsized and highly integrated, a more downsized electronic device and saving power consumption can be achieved.

Moreover, the optical sensor of the present invention can be provided in an electric pot as a sensor for controlling a temperature for keeping warm. After an indoor light is turned OFF, the temperature for keeping warm can be set low by the optical sensor of the present invention. Since the optical sensor is small and thin, it can be provided at a desired position. Consequently, saving electric power can be achieved.

The optical sensor of the present invention can be provided in a display of a CRT type projection TV as a sensor for adjusting a position of a scanning line (positioning of RGB scanning lines (Digital Auto Convergence)). Since the semiconductor device of the present invention can be downsized and highly integrated, the electronic device can be more downsized by using it, and a sensor can be provided at a desired position. In addition, high-speed automatic regulation of the CRT type projection TV is possible.

The optical sensor of the present invention can be provided in various domestic lighting equipment, an outdoor lamp, a street light, an unmanned public utility, an athletic field, a car, a calculator and the like as a sensor for controlling ON and OFF of various lighting equipment and lighting facilities. Electric power can be saved by the sensor of the present invention. A battery can be thinned to downsize an electronic device by providing a solar battery according to the present invention for such electronic devices as a battery.

This application is based on Japanese Patent Application serial no. 2003-347678 field in Japan Patent Office on Oct. 6, 2003, the contents of which are hereby incorporated by reference.

What is claimed is:

1. A semiconductor device comprising:
   a first substrate;
   a second substrate;
   a semiconductor element formed over the first substrate; and
   a conductive film formed on at least side surfaces of the second substrate,
   wherein one face of the first substrate and one face of the second substrate are fixed to each other via an adhesive joint member, and
   wherein the semiconductor element is electrically connected to the conductive film via the adhesive joint member.

2. A semiconductor device according to claim 1, wherein the adhesive joint member is an anisotropic conductive adhesive agent or an anisotropic conductive film.

3. A semiconductor device according to claim 1, wherein the first substrate is a thin substrate, a film-shaped substrate, or a sheet-like substrate.

4. A semiconductor device according to claim 1, wherein the first substrate is a substrate having insulation.

5. A semiconductor device according to claim 1, wherein the first substrate is a substrate that is a glass substrate, a plastic substrate, or a substrate formed from organic resin.

6. A semiconductor device according to claim 1, wherein the semiconductor element has a layer formed from a semiconductor material.

7. A semiconductor device according to claim 1, wherein the semiconductor element has a thin film transistor or a diode.

8. A semiconductor device according to claim 1, wherein the semiconductor element has a thin film transistor and a diode.

9. A semiconductor device according to claim 1, wherein the semiconductor device is an optical sensor, a photoelectric conversion, or a solar battery.

10. A semiconductor device according to claim 1, wherein the semiconductor device is an integrated circuit formed from a thin film transistor.

11. An electronic device having the semiconductor device according to claim 1, wherein the electronic device is selected from the group consisting of a cellular phone, a laptop personal computer, a gaming machine, a car navigation, a portable audio equipment, a handy AV equipment, a camera, an air-conditioner, a ventilation and air conditioning equipment, an electric pot, a CRT type projection TV, a lighting equipment, and lighting facilities.

12. A semiconductor device according to claim 1, wherein the adhesive joint member includes a conductive particle formed from one element or a plurality of elements selected from the group consisting of gold, silver, copper, palladium, and platinum.

13. A semiconductor device comprising:
   a semiconductor element;
   a first substrate in which a first connection terminal that is electrically connected to the semiconductor element is formed;
   a second substrate; and
   a second connection terminal formed on at least side surfaces of the second substrate,
   wherein the semiconductor element and the second substrate are bonded to each other via an adhesive joint member, and
   wherein the first connection terminal is electrically connected to the second connection terminal via the adhesive joint member.

14. A semiconductor device according to claim 13, wherein the adhesive joint member is an anisotropic conductive adhesive agent or an anisotropic conductive film.

15. A semiconductor device according to claim 13, wherein the first connection terminal is electrically connected to the second connection terminal via a conductive particle that is included in the adhesive joint member.

16. A semiconductor device according to claim 13, wherein the first substrate is a thin substrate, a film-shaped substrate, or a sheet-like substrate.

17. A semiconductor device according to claim 13, wherein the first substrate is a substrate having insulation.

18. A semiconductor device according to claim 13, wherein the first substrate is a substrate that is a glass substrate, a plastic substrate, or a substrate formed from organic resin.

19. A semiconductor device according to claim 13, wherein the semiconductor element has a layer formed from a semiconductor material.

20. A semiconductor device according to claim 13, wherein the semiconductor element has a thin film transistor or a diode.

21. A semiconductor device according to claim 13, wherein the semiconductor element has a thin film transistor and a diode.

22. A semiconductor device according to claim 13, wherein the semiconductor device is an optical sensor, a photoelectric conversion, or a solar battery.

23. A semiconductor device according to claim 13, wherein the semiconductor device is an integrated circuit formed from a thin film transistor.

24. An electronic device having the semiconductor device according to claim 13, wherein the electronic device is selected from the group consisting of a cellular phone, a laptop personal computer, a gaming machine, a car navigation, a portable audio equipment, a handy AV equipment, a camera, an air-conditioner, a ventilation and air conditioning equipment, an electric pot, a CRT type projection TV, a lighting equipment, and lighting facilities.

25. A semiconductor device according to claim 13,
wherein the adhesive joint member includes a conductive particle formed from one element or a plurality of elements selected from the group consisting of gold, silver, copper, palladium, and platinum.

26. A semiconductor device comprising:
a first substrate;
a second substrate;
a semiconductor element formed over the first substrate; and
conductive films each of which is formed over at least one face of the second substrate,
wherein one face of the first substrate and one face of the second substrate are fixed to each other via an adhesive joint member, and
wherein the semiconductor element is electrically connected to the conductive film via the adhesive joint member.

27. A semiconductor device according to claim 26,
wherein the adhesive joint member is an anisotropic conductive adhesive agent or an anisotropic conductive film.

28. A semiconductor device according to claim 26,
wherein the first substrate is a thin substrate, a film-shaped substrate, or a sheet-like substrate.

29. A semiconductor device according to claim 26,
wherein the first substrate is a substrate having insulation.

30. A semiconductor device according to claim 26,
wherein the first substrate is a substrate that is a glass substrate, a plastic substrate, or a substrate formed from organic resin.

31. A semiconductor device according to claim 26,
wherein the semiconductor element has a layer formed from a semiconductor material.

32. A semiconductor device according to claim 26,
wherein the semiconductor element has a thin film transistor or a diode.

33. A semiconductor device according to claim 26,
wherein the semiconductor element has a thin film transistor and a diode.

34. A semiconductor device according to claim 26,
wherein the semiconductor device is an optical sensor, a photoelectric conversion, or a solar battery.

35. A semiconductor device according to claim 26,
wherein the semiconductor device is an integrated circuit formed from a thin film transistor.

36. An electronic device having the semiconductor device according to claim 26, wherein the electronic device is selected from the group consisting of a cellular phone, a laptop personal computer, a gaming machine, a car navigation, a portable audio equipment, a handy AV equipment, a camera, an air-conditioner, a ventilation and air conditioning equipment, an electric pot, a CRT type projection TV, a lighting equipment, and lighting facilities.

37. A semiconductor device according to claim 26,
wherein the adhesive joint member includes a conductive particle formed from one element or a plurality of elements selected from the group consisting of gold, silver, copper, palladium, and platinum.

38. A semiconductor device comprising:
a semiconductor element;
a first substrate in which a first connection terminal that is electrically connected to the semiconductor element is formed;
a second substrate; and
a second connection terminal formed over at least one face of the second substrate,
wherein the semiconductor element and the second substrate are bonded to each other via an adhesive joint member, and
wherein the first connection terminal is electrically connected to the second connection terminal via the adhesive joint member.

39. A semiconductor device according to claim 38,
wherein the adhesive joint member is an anisotropic conductive adhesive agent or an anisotropic conductive film.

40. A semiconductor device according to claim 38,
wherein the first connection terminal is electrically connected to the second connection terminal via a conductive particle that is included in the adhesive joint member.

41. A semiconductor device according to claim 38,
wherein the first substrate is a thin substrate, a film-shaped substrate, or a sheet-like substrate.

42. A semiconductor device according to claim 38,
wherein the first substrate is a substrate having insulation.

43. A semiconductor device according to claim 38,
wherein the first substrate is a substrate that is a glass substrate, a plastic substrate, or a substrate formed from organic resin.

44. A semiconductor device according to claim 38,
wherein the semiconductor element has a layer formed from a semiconductor material.

45. A semiconductor device according to claim 38,
wherein the semiconductor element has a thin film transistor or a diode.

46. A semiconductor device according to claim 38,
wherein the semiconductor element has a thin film transistor and a diode.

47. A semiconductor device according to claim 38,
wherein the semiconductor device is an optical sensor, a photoelectric conversion, or a solar battery.

48. A semiconductor device according to claim 38,
wherein the semiconductor device is an integrated circuit formed from a thin film transistor.

49. An electronic device having the semiconductor device according to claim 38, wherein the electronic device is selected from the group consisting of a cellular phone, a laptop personal computer, a gaming machine, a car navigation, a portable audio equipment, a handy AV equipment, a camera, an air-conditioner, a ventilation and air conditioning equipment, an electric pot, a CRT type projection TV, a lighting equipment, and lighting facilities.

50. A semiconductor device according to claim 38,
wherein the adhesive joint member includes a conductive particle formed from one element or a plurality of elements selected from the group consisting of gold, silver, copper, palladium, and platinum.

* * * * *